(12) United States Patent
Wu

(10) Patent No.: US 11,417,718 B2
(45) Date of Patent: Aug. 16, 2022

(54) DISPLAY PANEL WITH TWO ELECTRICITY SUPPLY AREAS, MANUFACTURING METHOD THEREOF, AND DISPLAY DEVICE

(71) Applicant: Wuhan China Star Optoelectronics Semiconductor Display Technology Co., Ltd., Hubei (CN)

(72) Inventor: Junjie Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 198 days.

(21) Appl. No.: 16/754,774

(22) PCT Filed: Mar. 6, 2020

(86) PCT No.: PCT/CN2020/078161
§ 371 (c)(1),
(2) Date: Apr. 9, 2020

(87) PCT Pub. No.: WO2021/098084
PCT Pub. Date: May 27, 2021

(65) Prior Publication Data
US 2021/0408201 A1    Dec. 30, 2021

(30) Foreign Application Priority Data

Nov. 18, 2019   (CN) .......................... 201911126759.3

(51) Int. Cl.
*H01L 27/32* (2006.01)

(52) U.S. Cl.
CPC .... *H01L 27/3276* (2013.01); *H01L 2227/323* (2013.01)

(58) Field of Classification Search
CPC ...................... H01L 27/3276; H01L 2227/323
See application file for complete search history.

(56) References Cited

U.S. PATENT DOCUMENTS

| 7,675,233 B2* | 3/2010 | Lee ..................... H01L 27/3276 313/509 |
| 10,339,869 B1* | 7/2019 | Li ....................... H01L 27/3276 |
| 2005/0001546 A1* | 1/2005 | Yamaguchi ......... H01L 51/0008 313/512 |

(Continued)

FOREIGN PATENT DOCUMENTS

| CN | 110047896 A | 7/2019 |
| CN | 110061147 A | 7/2019 |

*Primary Examiner* — Lex H Malsawma
(74) *Attorney, Agent, or Firm* — Kirton McConkie; Evan R. Witt

(57) ABSTRACT

The disclosure provides a display panel, a manufacturing method thereof, and a display device. A display area is defined on a surface of the display panel, and a first electricity supply area and a second electricity supply area are disposed opposite to each other at two sides of the display area. The display panel includes a substrate layer, and a first metal layer and a second metal layer which are sequentially disposed on the substrate layer, and an insulating layer is further disposed between the first metal layer and the second metal layer in the display area.

18 Claims, 4 Drawing Sheets

(56) References Cited

U.S. PATENT DOCUMENTS

| | | | |
|---|---|---|---|
| 2005/0029937 A1* | 2/2005 | Kim | H01L 27/3276 313/506 |
| 2006/0001792 A1* | 1/2006 | Choi | H01L 27/3223 349/54 |
| 2006/0250083 A1* | 11/2006 | Oh | H01L 27/3279 313/512 |
| 2007/0096135 A1* | 5/2007 | Matsumoto | H01L 27/3276 257/99 |
| 2010/0277449 A1* | 11/2010 | Kanda | G09G 3/3233 345/206 |
| 2011/0291119 A1* | 12/2011 | Ryu | H01L 51/524 257/88 |
| 2012/0001885 A1 | 1/2012 | Kang et al. | |
| 2015/0070616 A1* | 3/2015 | Ogasawara | G02F 1/1368 349/43 |
| 2016/0204186 A1* | 7/2016 | Han | H01L 27/3279 257/40 |
| 2017/0194593 A1* | 7/2017 | Ma | H01L 27/3279 |
| 2017/0288008 A1* | 10/2017 | Kim | H01L 27/3206 |
| 2018/0314122 A1* | 11/2018 | Saitoh | H01L 27/1218 |
| 2019/0043938 A1* | 2/2019 | Lee | H01L 27/1222 |
| 2020/0212356 A1* | 7/2020 | Kim | H01L 27/3276 |

* cited by examiner

DISPLAY PANEL WITH TWO ELECTRICITY SUPPLY AREAS, MANUFACTURING METHOD THEREOF, AND DISPLAY DEVICE

FIELD

The present disclosure relates to the field of display panel technologies, and more particularly, relates to a display panel, a manufacturing method thereof, and a display device.

BACKGROUND

Organic light-emitting diodes (OLEDs) have various exceptional properties such as self-luminescence, low power consumption, wide viewing angles, and fast response times, and panels made of OLEDs have simple structures and are bendable. As a result, OLEDs have evoked interest from scientific and industrial communities and are regarded as a promising next-generation display technology.

Brightness uniformity is an important indicator for judging quality of display panels. Poor brightness uniformity causes brightness inconsistency at different parts of a panel, which makes human eyes consume more energy to process, resulting in eye fatigue. In small-scale panels, a driver chip is only disposed on one side of the panels, leading to asymmetry of brightness distribution and poor brightness uniformity on the panels.

Consequently, it is necessary to develop a novel display panel to overcome defects of conventional technology.

SUMMARY

An objective of the present disclosure is to provide a display panel to solve a problem of non-uniform brightness on conventional display panels.

To achieve the above goal, the present disclosure provides a display panel, including a display area defined on a surface of the display panel, and a first electricity supply area and a second electricity supply area, which are disposed opposite to each other at two sides of the display area. The display panel includes a substrate layer, and a first metal layer and a second metal layer, which are sequentially disposed on the substrate layer. An insulating layer is further disposed between the first metal layer and the second metal layer in the display area, and the first metal layer and the second metal layer are vertically connected to each other in the first electricity supply area and the second electricity supply area.

Furthermore, in other embodiments, the second metal layer has a vertical line structure in the display area.

Furthermore, in other embodiments, the second metal layer has a grid structure in the display area.

Furthermore, in other embodiments, the second metal layer has a planar structure in the display area.

Furthermore, in other embodiments, a material of the second metal layer includes Mo or Cu.

Furthermore, in other embodiments, a material of the insulating layer includes silicon oxide or silicon nitride.

Furthermore, in other embodiments, a material of the first metal layer includes Mo or Cu.

Furthermore, in other embodiments, a driver chip is disposed in the display panel and provides an input voltage to a pixel electrode of the display panel, and a voltage output end of the driver chip is connected to the first metal layer in the first electricity supply area.

Another objective of the present disclosure is to provide a method of manufacturing the display panel, including following steps:

step 1: providing the substrate layer, and forming the first metal layer on the substrate layer;

step 2: depositing the insulating layer on the first metal layer in the display area; and step 3: depositing the second metal layer on the insulating layer, wherein the second metal layer is deposited on the first metal layer in the first electricity supply area and the second electricity supply area.

Yet another objective of the present disclosure is to provide a display device. The display device includes a main body, and the display panel provided by the present disclosure is disposed on the main body.

Compared with conventional technology, the present disclosure has following beneficial effects: the present disclosure provides a display panel, a manufacturing method thereof, and a display device. An input voltage at a side of the display panel near a driver chip is drawn to another side of the display panel by lines of a second metal layer. Therefore, both sides of the display panel have the input voltage, thereby increasing current in the side of the display panel away from the driver chip and further improving brightness uniformity on the display panel.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which those skilled in the art can derive further figures without making any inventive efforts.

DETAILED DESCRIPTION

Hereinafter a preferred embodiment of the present disclosure will be described with reference to the accompanying drawings to exemplify the embodiments of the present disclosure can be implemented, which can fully describe the technical contents of the present disclosure to make the technical content of the present disclosure clearer and easy to understand. However, the described embodiments are only some of the embodiments of the present disclosure, but not all of the embodiments. All other embodiments obtained by those skilled in the art based on the embodiments of the present disclosure without creative efforts are within the scope of the present disclosure.

The specific structures and detail functions disclosed herein are merely representative and are for purposes of describing exemplary embodiments of the present invention. However, the present invention may be embodied in many alternative forms and should not be construed as being limited to the embodiments set forth herein.

First Embodiment

Brightness uniformity is an important indicator for judging quality of display panels. Poor brightness uniformity causes brightness inconsistency at different parts of a panel, which makes human eyes consume more energy to process, resulting in eye fatigue. In small-scale panels, a driver chip is only disposed on one side of the panels, leading to asymmetry of brightness distribution and poor brightness uniformity on the panels.

Figure 1:
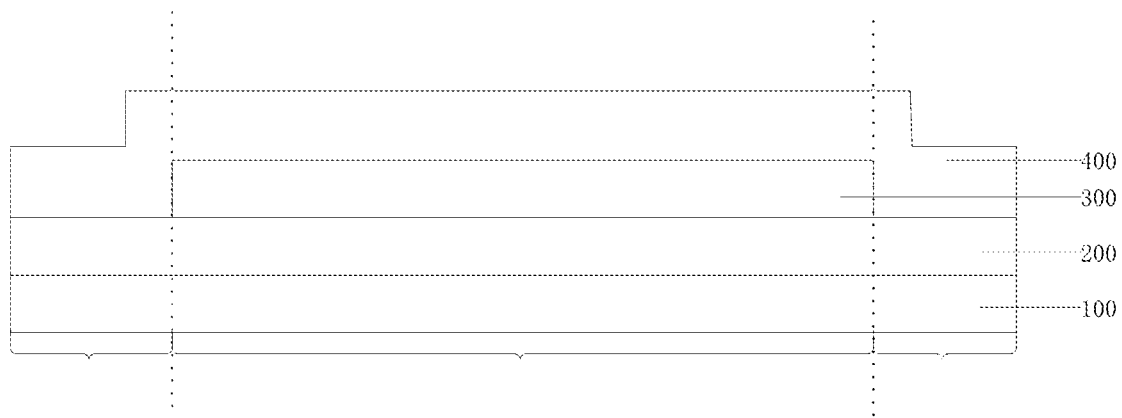
FIG. 1 is a schematic sectional view showing a structure of a display panel provided by a first embodiment of the present disclosure.

The present embodiment provides a display panel with improved brightness uniformity. Refer to FIG. 1, a schematic sectional view showing a structure of the display panel provided by the present embodiment is shown. A display area 1, a first electricity supply area 2, and a second electricity supply area 3 are defined on a surface of the display panel, and the first electricity supply area 2 and the second electricity supply area 3 are respectively disposed at two sides of the display area 1.

The first electricity supply area 2 and the second electricity supply area 3 of the display panel includes a substrate layer 100, and a first metal layer 200 and a second metal layer 400, which are sequentially disposed on the substrate layer 100. The display area 1 includes the substrate 100, the first metal layer 200 disposed on the substrate layer 100, and the second metal layer 400 disposed on the first metal layer 200, wherein an insulating layer 300 is further disposed between the first metal layer 200 and the second metal layer 400.

Figure 2:
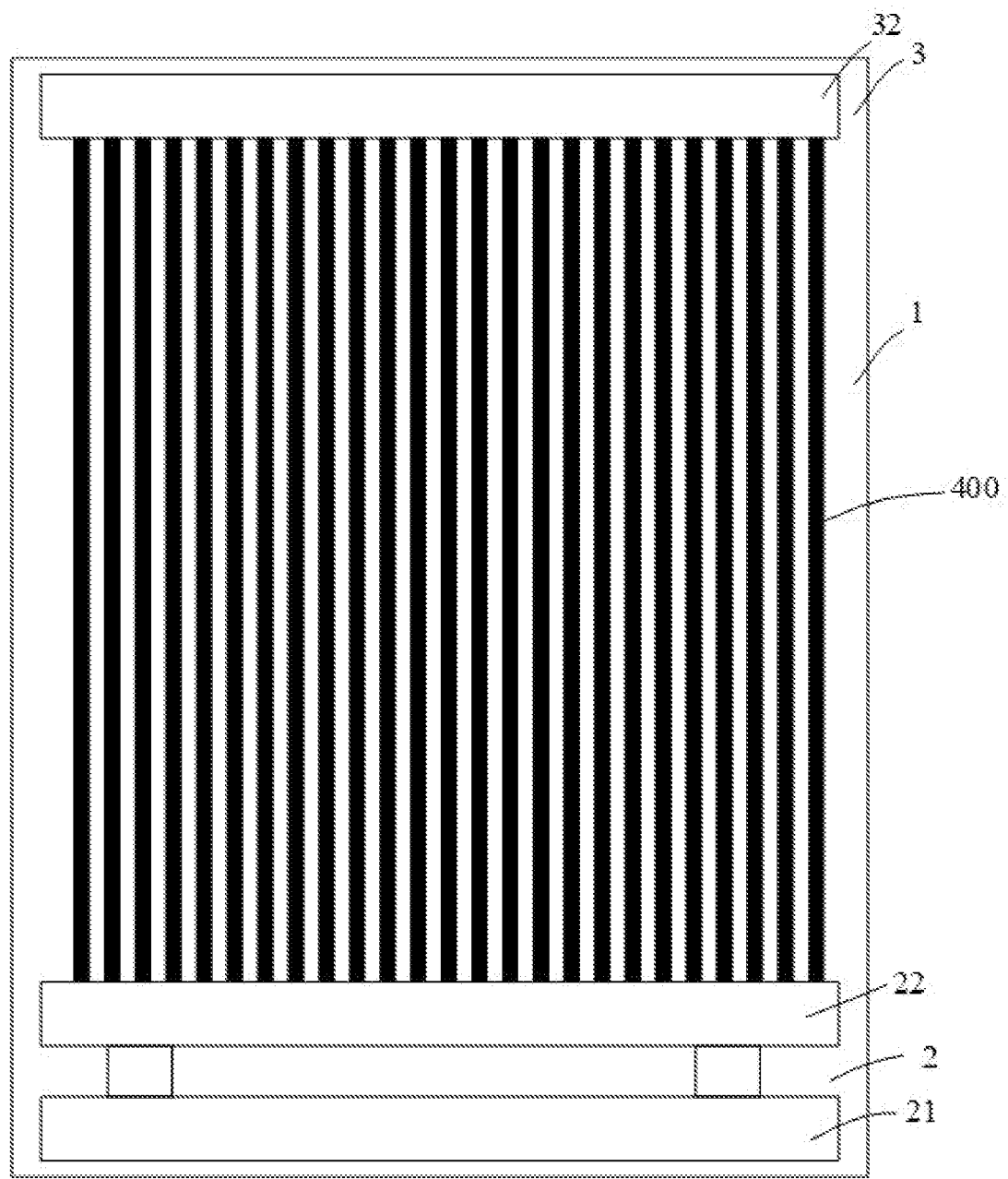
FIG. 2 is a schematic top view showing the structure of the display panel provided by the first embodiment of the present disclosure.

Refer to FIG. 2, a schematic top view showing the display panel provided by the present embodiment is shown. In the present embodiment, the first electricity supply area 2 is disposed below the display area 1. A driver chip 21 is disposed in the first electricity supply area 2. A voltage output end of the driver chip 21 is connected to the first metal layer 200 in the first electricity supply area 2. The driver chip 21 provides a first input voltage 22 to a pixel electrode of the display panel.

In the first electricity supply area 2 and the second electricity supply area 3, the second metal layer 400 is connected to the first metal layer 200, and the first input voltage 22 is drawn to the second electricity supply area 3 by the second metal layer to form a second input voltage 32.

In the present embodiment, a material of the second metal layer 400 includes Mo or Cu, a material of the insulating layer 300 includes silicon oxide or silicon nitride, and a material of the first metal layer 200 includes Mo or Cu.

In the present embodiment, the first input voltage 22 is connected to the second input voltage 32 by lines of the second metal layer 400.

When the display panel is turned on, current in a side of the display area 1 away from the driver chip 21 decreases because of electrical resistances of lines of the first metal layer 200. Therefore, an upper section of the display panel is darker than a lower section of the display panel. In the present embodiment, an input voltage of the first electricity supply area 2 on a bottom side of the display panel is drawn to the second electricity supply area 3 on a top side of the display panel by the lines of the second metal layer 400, thereby further increasing current in the upper section of the display panel and significantly improving brightness uniformity on the display panel.

Second Embodiment

Figure 3:
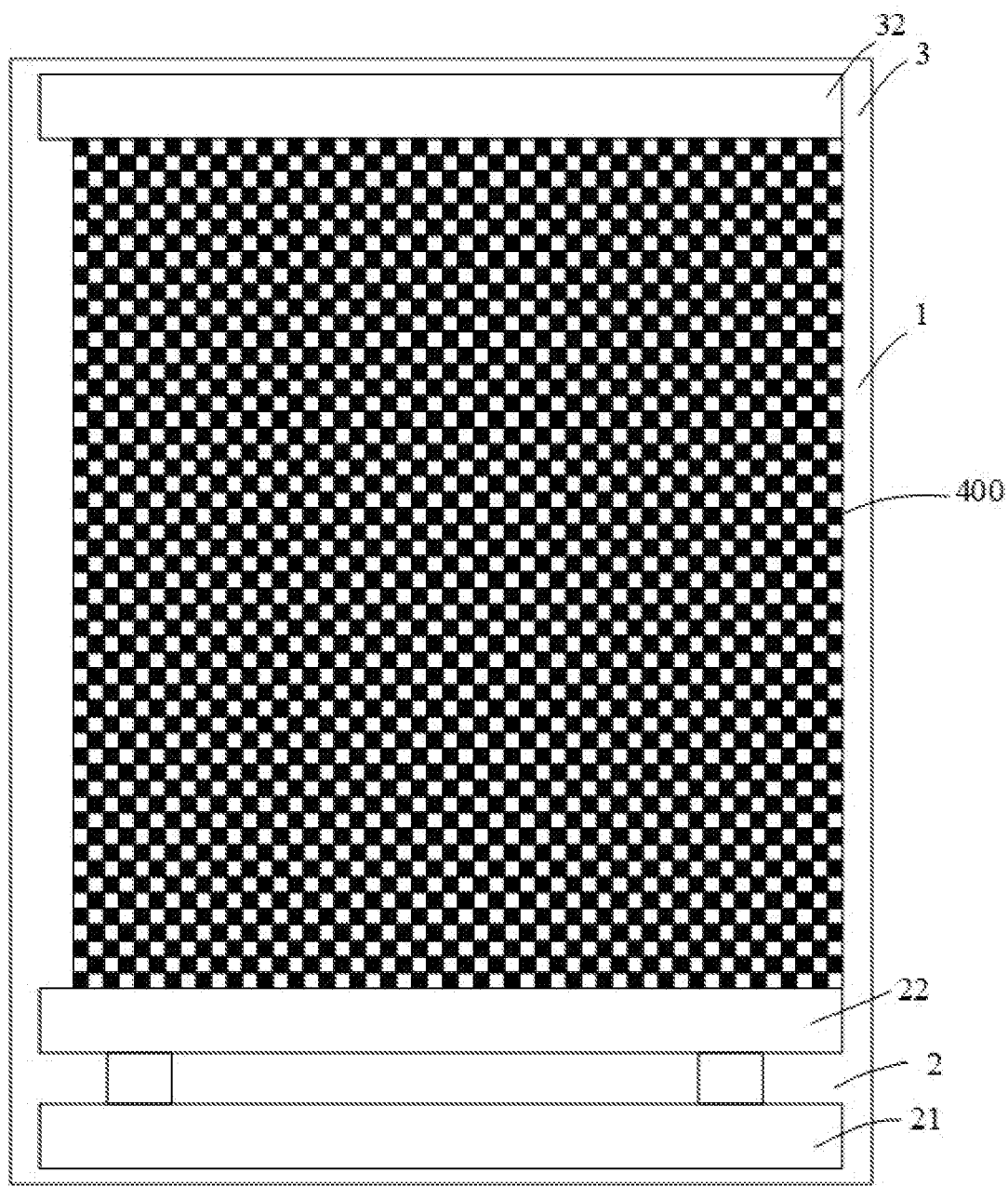
FIG. 3 is a schematic top view showing a structure of a display panel provided by a second embodiment of the present disclosure.

A display panel provided by the present embodiment also defines a display area, a first electricity supply area, and a second electricity supply area. A structure of the display panel provided by the present embodiment is almost similar to the structure of the display panel provided by the first embodiment, wherein same structures can be referred to corresponding descriptions in the first embodiment and are not described again here. A difference between the present embodiment and the first embodiment is that the first input voltage is connected to the second input voltage by a first metal layer 400 with a grid structure. Refer to FIG. 3, a schematic top view showing a structure of the display panel provided by the present embodiment is shown.

In the present embodiment, the input voltage of the first electricity supply area 2 on the bottom side of the display panel is drawn to the second electricity supply area 3 on the top side of the display panel by the second metal layer 400 with the grid structure. Therefore, both sides of the display panel have the input voltage, and electrical resistance of the second metal layer 400 with the grid structure is less than that of the second metal layer 400 with vertical lines. As a result, current in the upper section of the display panel may increase, and brightness uniformity on the display panel is significantly improved.

Third Embodiment

Figure 4:
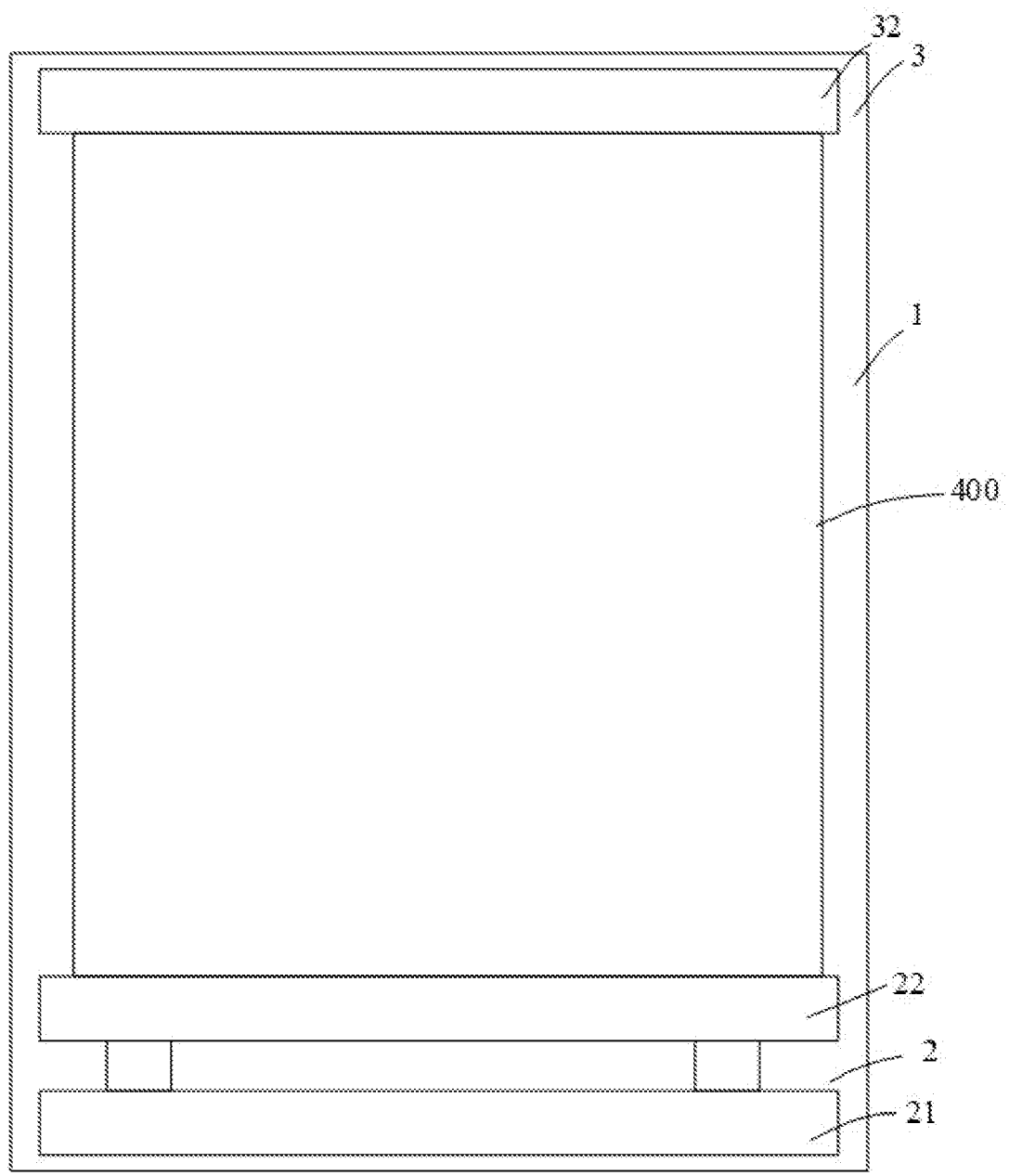
FIG. 4 is a schematic top view showing a structure of a display panel provided by a third embodiment of the present disclosure.

A display panel provided by the present embodiment also defines a display area, a first electricity supply area, and a second electricity supply area. A structure of the display panel provided by the present embodiment is almost similar to the structure of the display panel provided by the first embodiment, wherein same structures can be referred to corresponding descriptions in the first embodiment and are not described again here. A difference between the present embodiment and the first embodiment is that the first input voltage is connected to the second input voltage by a first metal layer 400 with a planar structure. Refer to FIG. 4, a schematic top view showing a structure of the display panel provided by the present embodiment is shown.

In the present embodiment, the input voltage of the first electricity supply area 2 on the bottom side of the display panel is drawn to the second electricity supply area 3 on the top side of the display panel by the second metal layer 400 with the planar structure. Therefore, both sides of the display panel have the input voltage, and electrical resistance of the second metal layer 400 with the planar structure is less than that of the second metal layer 400 with the vertical lines. As a result, current in the upper section of the display panel may increase, and brightness uniformity on the display panel is significantly improved.

Fourth Embodiment

The present embodiment provides a method of manufacturing the display panel mentioned in the first embodiment, including following steps:

step 1: providing the substrate layer, and forming the first metal layer on the substrate layer;

step 2: depositing the insulating layer on the first metal layer in the display area; and step 3: depositing the second metal layer on the insulating layer, wherein the second metal layer is deposited on the first metal layer in the first electricity supply area and the second electricity supply area.

An input voltage at a side of the display panel near a driver chip is drawn to another side of the display panel by lines of a second metal layer. Therefore, both sides of the display panel have the input voltage, thereby increasing current in the side of the display panel away from the driver chip and further improving brightness uniformity on the display panel.

Fifth Embodiment

The present embodiment provides a display device including a main body, wherein the display panel mentioned in the first embodiment is disposed on the main body.

Regarding the beneficial effects: the present disclosure provides a display panel, a manufacturing method thereof, and a display device. An input voltage at a side of the display panel near a driver chip is drawn to another side of the display panel by a second metal line. Therefore, both sides of the display panel have the input voltage, thereby increasing current in the side of the display panel away from the driver chip and further improving brightness uniformity on the display panel.

The above are merely preferred embodiments of the present invention. It is understood that many changes and modifications to the described embodiments can be carried out without departing from the scope and the spirit of the disclosure that is intended to be limited only by the appended claims.

What is claimed is:

1. A display panel, comprising a display area defined on a surface of the display panel, and a first electricity supply area and a second electricity supply area, which are disposed opposite to each other at two sides of the display area;
   wherein the display panel comprises a substrate layer, and a first metal layer and a second metal layer which are sequentially disposed on the substrate layer, an insulating layer is further disposed between the first metal layer and the second metal layer in the display area, a driver chip is disposed in the display panel and provides an input voltage to a pixel electrode of the display panel, a voltage output end of the driver chip is connected to the first metal layer in the first electricity supply area, the first metal layer and the second metal layer are vertically and electrically connected to each other in the first electricity supply area and the second electricity supply area, and the first metal layer and the second metal layer are insulated from each other in the display area.

2. The display panel of claim 1, wherein the second metal layer has a vertical line structure in the display area.

3. The display panel of claim 1, wherein the second metal layer has a grid structure in the display area.

4. The display panel of claim 1, wherein the second metal layer has a planar structure in the display area.

5. The display panel of claim 1, wherein a material of the second metal layer comprises Mo or Cu.

6. The display panel of claim 1, wherein a material of the insulating layer comprises silicon oxide or silicon nitride.

7. The display panel of claim 1, wherein a material of the first metal layer comprises Mo or Cu.

8. A method of manufacturing the display panel of claim 1, comprising following steps:
   step 1: providing the substrate layer, and forming the first metal layer on the substrate layer;
   step 2: depositing the insulating layer on the first metal layer in the display area; and
   step 3: depositing the second metal layer on the insulating layer, wherein a driver chip is disposed in the display panel and provides an input voltage to a pixel electrode of the display panel, a voltage output end of the driver chip is connected to the first metal layer in the first electricity supply area, the second metal layer is electrically deposited on the first metal layer in the first electricity supply area and the second electricity supply area, and the second metal layer and the first metal layer are insulated from each other in the display area.

9. The method of claim 8, wherein the second metal layer has a vertical line structure in the display area.

10. The method of claim 8, wherein the second metal layer has a grid structure in the display area.

11. The method of claim 8, wherein the second metal layer has a planar structure in the display area.

12. The method of claim 8, wherein a material of the second metal layer comprises Mo or Cu.

13. The method of claim 8, wherein a material of the insulating layer comprises silicon oxide or silicon nitride.

14. The method of claim 8, wherein a material of the first metal layer comprises Mo or Cu.

15. A display device, comprising a main body, wherein the display panel of claim 1 is disposed on the main body.

16. The display device of claim 15, wherein the second metal layer has a vertical line structure in the display area.

17. The display device of claim 15, wherein the second metal layer has a grid structure in the display area.

18. The display device of claim 15, wherein the second metal layer has a planar structure in the display area.

* * * * *